(12) United States Patent
Danovitch et al.

(10) Patent No.: US 10,679,966 B2
(45) Date of Patent: Jun. 9, 2020

(54) GALLIUM LIQUID METAL EMBRITTLEMENT FOR DEVICE REWORK

(71) Applicant: International Business Machines Corporation, Armonk, NY (US)

(72) Inventors: David Danovitch, Granby (CA); Yolande Elodie Nguena Dongmo, Sherbrooke (CA); Richard Langlois, Granby (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 262 days.

(21) Appl. No.: 15/818,092

(22) Filed: Nov. 20, 2017

(65) Prior Publication Data
US 2018/0233483 A1 Aug. 16, 2018

Related U.S. Application Data

(63) Continuation of application No. 15/432,015, filed on Feb. 14, 2017.

(51) Int. Cl.
*H01L 23/00* (2006.01)
*B23K 1/018* (2006.01)
*B23K 3/08* (2006.01)

(52) U.S. Cl.
CPC .............. *H01L 24/98* (2013.01); *B23K 1/018* (2013.01); *B23K 3/082* (2013.01); *H01L 24/799* (2013.01); *H01L 2224/98* (2013.01); *Y10T 29/53274* (2015.01)

(58) Field of Classification Search
CPC ... H01L 2224/98; H01L 24/98; H01L 24/799; B23K 1/018; B23K 3/082; Y10T 29/53274; Y10T 29/53; Y10T 29/53309

USPC ....... 29/700, 762, 770, 832, 829, 825, 592.1
See application file for complete search history.

(56) References Cited

U.S. PATENT DOCUMENTS

| 5,785,237 A * | 7/1998 | Lasto | B23K 1/012 228/180.22 |
| 8,167,189 B2 | 5/2012 | Zinn et al. | |
| 2007/0228109 A1 | 10/2007 | Smith et al. | |

FOREIGN PATENT DOCUMENTS

JP 2005230777 A 9/2005

OTHER PUBLICATIONS

Naoe Hosada—"A Novel Approach to Disassembly of joined Interface"—JIEP-6 2005 IEEE, pp. 592-593 (Year: 2005).*

(Continued)

*Primary Examiner* — Peter Dungba Vo
*Assistant Examiner* — Azm A Parvez
(74) *Attorney, Agent, or Firm* — Cantor Colburn LLP; Alvin Borromeo (57) ABSTRACT

A method for removing an electrical component from a substrate where the component is coupled to the substrate by connection elements. The method includes disposing liquid gallium (Ga) at or near an edge of the component and dispersing the liquid Ga between the substrate and the component such that the liquid Ga contacts one or more of the connection elements. The method also includes maintaining the liquid Ga between the substrate, component and one or more of the connection elements for a prescribed time period and removing the component from the substrate by applying a mechanical force to the component.

13 Claims, 7 Drawing Sheets

(56) References Cited

OTHER PUBLICATIONS

List of IBM Patents or Patent Applications Treated as Related; (Appendix P), Filed Nov. 29, 2017; 2 pages.

David Danovitch et al., "Gallium Liquid Metal Embrittlement for Device Rework", U.S. Appl. No. 15/432,015, filed Feb. 14, 2017.

Chen et al., "The Effects if Gallium Additions on Microstructures and Thermal and Mechanical Properties of Sn—9Zn Solder Alloys," 2014; 10 Pages.

Disclosed Anonymously "Low Temperature BGA Rework," ip.com Mar. 12, 2013; 8 Pages.

Hosoda, et al., "A Novel Approach to Disassembly of Joined Interface", JIEP-6 2005 IEEE, pp. 592-593.

Huffer, et al. "Formation of Spherical and Non-Spherical Eutectic Gallium-Indium Liquid-Metal Microdroplets in Microfluidic Channels at Room Temperature" Advanced Functional Materials. 2012, 22, 264-2631.

Luo, et al. Effects of Ga addition on microstructure and properties of Sn—0.5Ag—0.7Cu solder, J Mater Sci: Mater Electron (2014) 25:3566-3571.

Thelen, et al. "A study of the production and reversible stability of EGaIn liquid metal microspheres using flow focusing" Lab on a Chip, 2012, 12, 3961-3967.

Fernandes, Specificity in Liquid Metal Induced Embrittlement, PII:S1350-6307(96)00022-2, Engineering Failure Analysis, vol. 3, No. 4 pp. 299-302, 1996.

Hirvonen, et al. Use of Liquid Metal Embrittlement (LME) for Controlled Fracture, Army Research Laboratory, ARL-TR-4976, Sep. 2009, 48 pages.

\* cited by examiner

GALLIUM LIQUID METAL EMBRITTLEMENT FOR DEVICE REWORK

DOMESTIC PRIORITY

This application is a continuation of U.S. patent application Ser. No. 15/432,015 filed Feb. 14, 2017, the entire contents of which are incorporated herein by reference.

BACKGROUND

The present invention relates in general to semiconductor device rework methods and apparatus and removing such devices from their package. More specifically, the present invention relates to utilizing a gallium containing liquid metal to break interconnections between a semiconductor device, or chip, and a substrate supporting the chip.

Once the formation of semiconductor devices and interconnects on a semiconductor wafer is completed, the semiconductor wafer is diced into semiconductor chips, or "dies." Functional semiconductor chips are then packaged to facilitate mounting to a larger device.

The packaging generally provides mechanical protection and electrical connections to an external element such as a substrate. One typical packaging technology to provide electrical connections is Controlled Collapse Chip Connection (C4) packaging, which employs C4 balls each of which contacts a C4 pad on the semiconductor device and another C4 pad on a packaging substrate. The packaging substrate may then be assembled on a larger circuit board. The connection between the packaging substrate and the larger circuit board may also utilize solder connection elements similar to C4 balls and known as ball grid arrays (BGA).

The connection between the semiconductor device and the substrate are not limited to C4 and any type of connection may be made. The connection between the semiconductor device and the substrate may experience physical forces that cause for a particular semiconductor device to lose one or more connections to the substrate due to breakage. Further, in operation, the semiconductor device may include some areas that run hotter than others. This can, again, lead to stresses experienced by connections (e.g., the C4) between the semiconductor device and the substrate. Such stresses can, in severe cases, lead to a broken connection which can reduce the effectiveness of a particular semiconductor device or even render it non-functional.

Regardless of the cause, it is apparent that in some cases the semiconductor device may need to be removed from the substrate. This typically requires that the combination of the substrate and the semiconductor device be exposed to a temperature that is greater than the melting point of the connection mechanism (e.g., solder balls) between them or exposing the substrate and the semiconductor device to a prying or other force that can break the connection mechanism.

SUMMARY

According to one or more embodiments of the present invention, a method for removing an electrical component from a substrate, the component being coupled to the substrate by connection elements, is disclosed. The method includes: disposing liquid gallium (Ga) at or near an edge of the component; dispersing the liquid Ga between the substrate and the component such that the liquid Ga contacts one or more of the connection elements; maintaining the liquid Ga between the substrate, component and one or more of the connection elements for a prescribed time period; and removing the component from the substrate by applying a mechanical force to the component.

According to one or more embodiments of the present invention, an electrical component removal apparatus used in a process to remove the electrical component from a substrate to which it is attached by one or more connection elements is disclosed. The apparatus includes an inlet wall, an outlet wall and side walls connect the inlet and outlet walls. The apparatus also includes a top connecting the inlet wall, the outlet wall and the side walls, an inlet into which liquid Ga may be introduced and an outlet through which air can be extracted causing the liquid Ga to travel from the inlet wall towards the outlet wall when the apparatus is disposed over the electrical component.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of aspects of the present invention, embodiments described herein provide a manner to remove a chip or other component from a substrate by utilizing a liquid gallium to cause the inter-connections between the component and the substrate to become brittle. Turning now to a more detailed description of aspects of the present invention, embodiments described utilized Ga to remove a chip or other components such as a capacitor, inductor or the like to be removed from a substrate. Herein, the term component shall include the term chip and is not limited to the components listed herein.

Figure 1:
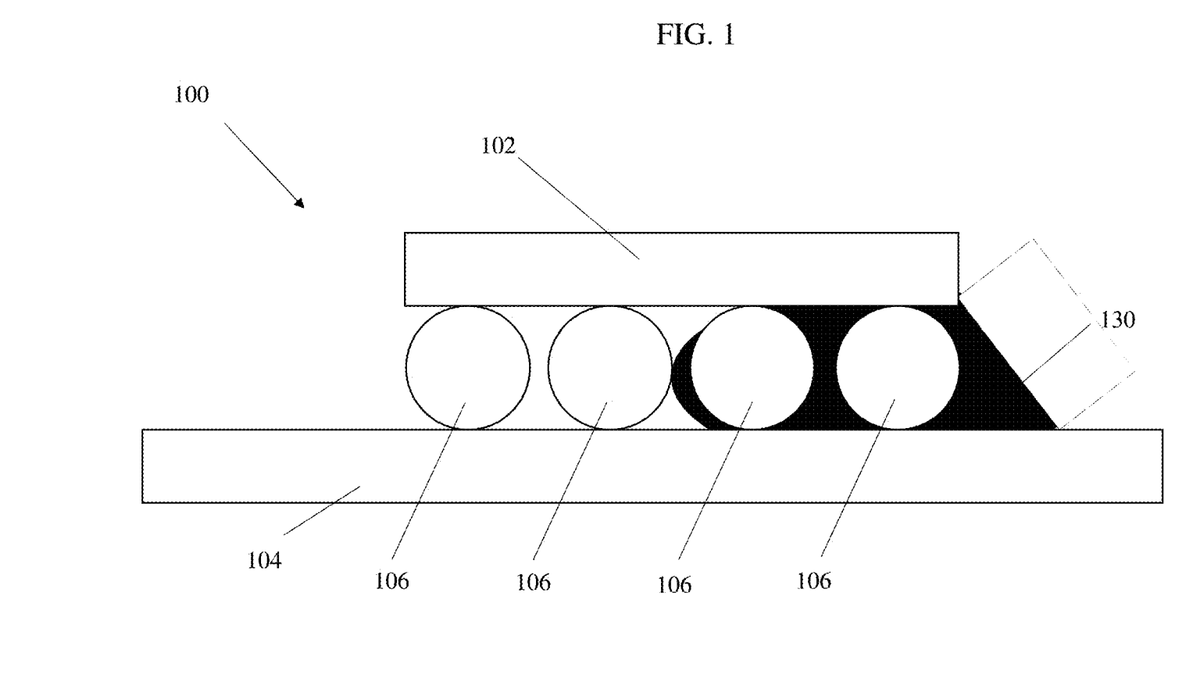
FIG. 1 depicts a side view of a structure having liquid gallium (Ga) disposed between a component and a substrate with the liquid Ga contacting connection elements (e.g., solder balls) disposed between and connecting the component and the substrate.

In FIG. 1 illustrates a package 100 that includes a substrate 104 having a component 102 physically and electrically connected together by connection elements 106. Connection elements 106 are shown as solder balls in FIG. 1 but it shall be understood that any type of connection element could be used. The substrate 104 can be of any suitable substrate material such as ceramic or organic material. A ceramic substrate can be formed of a single piece of ceramic and one or more metallization and dielectric layers on either or both sides thereof. Of course, the substrate could include multiple layers in one embodiment with metallization and dielectric layers that are sintered together and known as an HTCC (High Temperature Co-fired Ceramic) or an LTCC (Low Temperature Co-fired Ceramic), depending upon the materials chosen. Similarly, an organic substrate, which is much like a printed circuit board and is often called a laminate substrate or laminate, has many variations where several layers of copper and dielectric layers are laminated together to form a core and a number of 'build-up layers' of copper and dielectric can be laminated on either or both sides of the core.

A liquid Ga containing fluid 130 is shown at least partially disposed between the component 102 and the substrate 104. The liquid Ga containing fluid 130 will be referred to as "liquid Ga" herein. The liquid Ga 130 can be a solitary (e.g., pure) liquid or can be a combination of liquid Ga particles disposed in a carrier fluid such as a flux or other carrier fluid such as glycerol and water or a glycerol-water-PVA (polyvinyl Alcohol) solution. In one embodiment, the liquid Ga particles may be formed by utilizing a flow focusing device. A further explanation of how such flow focusing devices can form liquid Ga particles is contained in "Formation of Spherical and Non-Spherical Eutectic Gallium-Indium Liquid-Metal Microdroplets in Microfluidic Channels at Room Temperature," by Tanya Hutter, Wolfgang-Andreas C. Bauer, Stephen R. Elliott, and Wilhelm T. S. Huck, in Advances in Functional Matter, 2012, 22, pages 2624-2631 and "A study of the production and reversible stability of EGaIn liquid metal microspheres using flow focusing," by Jacob Thelen, a Michael D. Dickey and Thomas Ward in Lab Chip, 2012, 12, pages 3961-3967, both of which are incorporated herein in their entirety.

As shown, the liquid Ga 130 contacts the some but not all of the connection elements 106. The connection elements are solder balls in one embodiment and, in a particular embodiment, are lead free solder balls. Capillary action may cause the liquid Ga to eventually contact all of the connection elements 106. The liquid Ga 130 causes the connection element 106 to become brittle and, thus, easier to remove. As will be further discussed below, in some cases, the liquid Ga 130 may not effectively or in a timely manner, disperse to contact all of the connection elements 106. As such, a vacuum or other method of urging the liquid Ga 130 (e.g. any type of suction) to flow under the component 102 may be utilized. However, capillary action is considered as one manner of dispersion and is included in the terms "disperse," "dispersion" or "dispersing" used herein.

Figure 2:
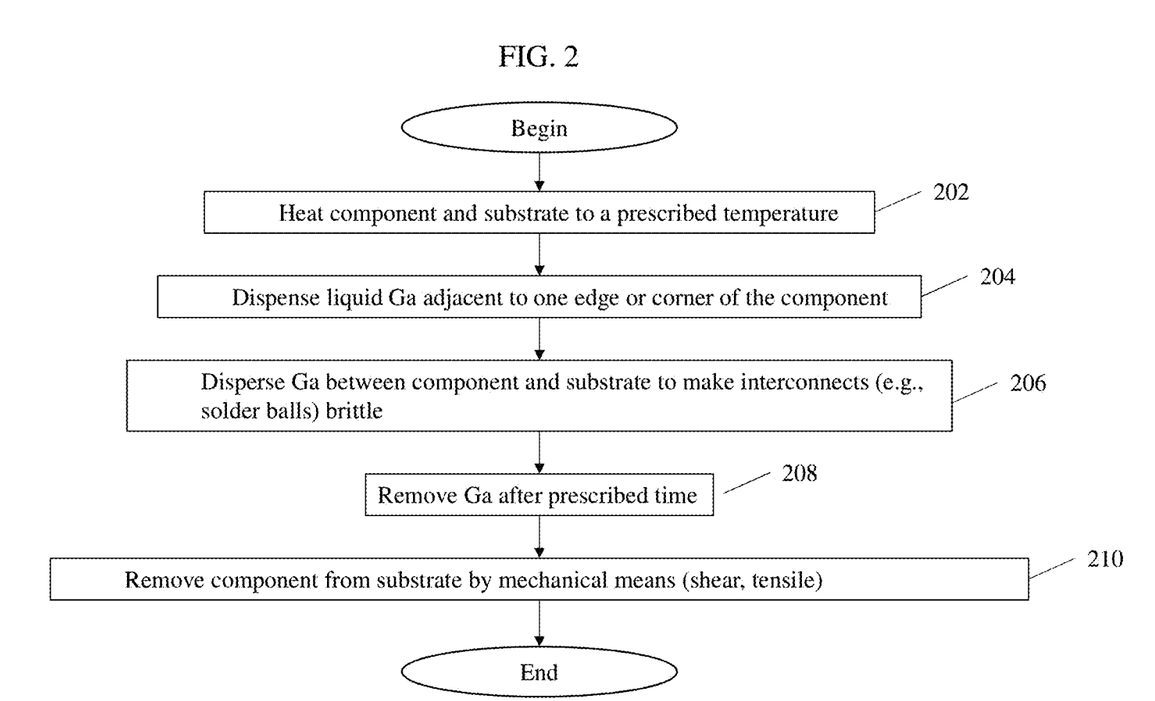
FIG. 2 is a flow chart of a method of removing a component from a substrate according to one embodiment.

FIG. 2 is a flow chart of a method according to one embodiment. At block 202, the component and substrate (also referred to as a module) can be heated to a prescribed temperature. The temperature is less than the temperature typically utilized to reflow a solder. For example, the module can be heated to between 40 and 100 degrees C. This lower temperature may reduce the possible effects to other chips/components during a removal process.

At block 204, liquid Ga is disposed on one or more edges/corners of the component and dispersed under the component at block 206. The liquid Ga can be dispersed, in one embodiment, at a temperature between 40 and 100 degrees C. The dispersion is due to capillary action in one embodiment but other methods such as those disclosed below can be utilized. The result of the liquid Ga contact with the connection elements between the component and the substrate is that the connection elements become brittle. After a certain amount of time (e.g., a time sufficient to cause the connection elements to become brittle), the liquid Ga may be removed at optional block 208. At block 210, the component is removed from the substrate by application of a mechanical stress such as shear (e.g, prying) or tensile (e.g., application of a vacuum to an upper surface of the semiconductor device. It shall be understood that the removal of the liquid Ga at block 208 can occur after the component has been removed in one embodiment and may be omitted in others.

Further, it shall be understood that the removal method disclosed herein may allow for the removal of a defective component while still allowing for the removed component to be replaced by a functional component (e.g., a repair). Thus it is important to preserve the integrity and the quality of the connecting pads on the substrate on which that new component will eventually be attached. The method disclosed herein, may have the technical effect of allowing for removal while allowing for a replacement. Further, the amount of time that the gallium contacts the connection elements may be selected such that it allows for removal but minimizes additional damage that could be induced by the gallium to the substrate.

Figure 3:
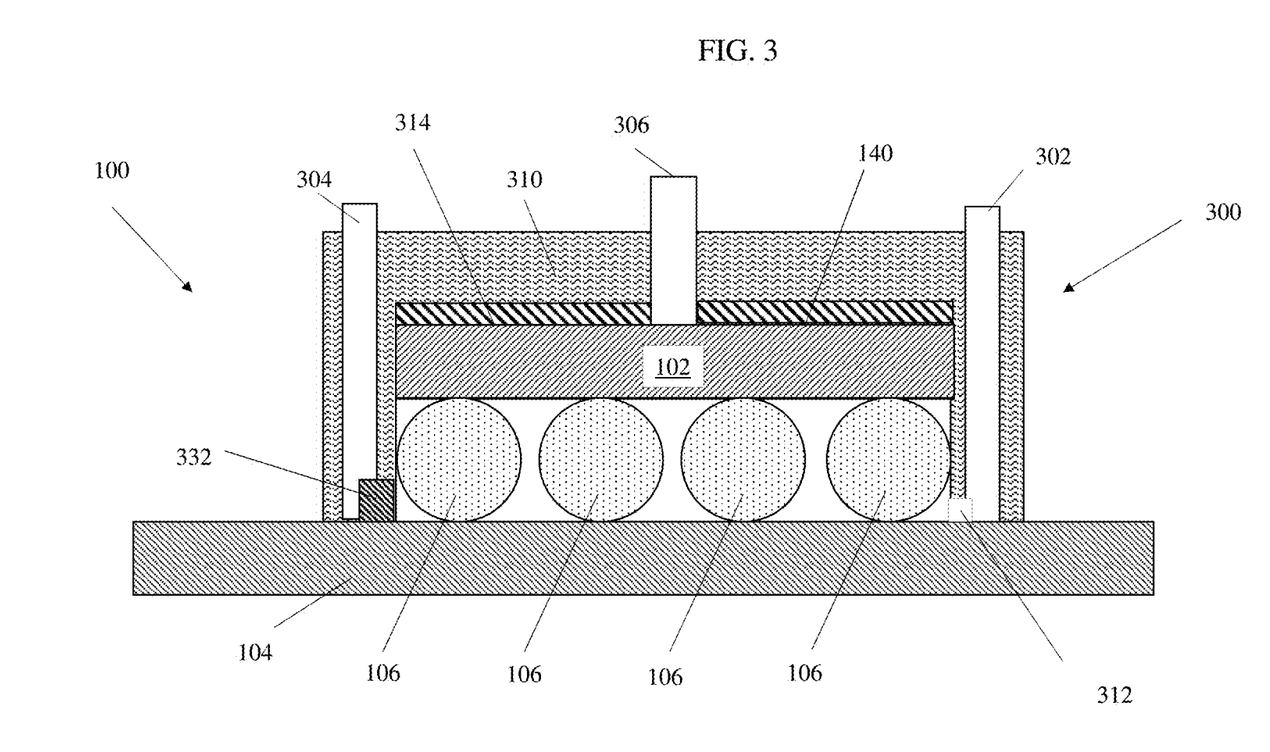
FIG. 3 is a cross-section of a component/substrate combination covered by a removal apparatus that dispersed liquid Ga between the component and the substrate.

FIG. 3 shows a cross-section of a component removal apparatus 300 disposed over the component 102. The component 102 is connected to the substrate 104 by connection element 106.

The apparatus 300 includes an inlet 302 into which liquid Ga or other fluids may be introduced. The inlet 302 passes through the body 310 of the apparatus 300. The body 310 can be shaped such that it can be placed over and surround the sides of the component 102 and the connection elements 106. The apparatus 300 can also include an outlet 304 through which air or another fluid can be extracted from below the component 102. Optionally, a filter 332 can be provided that allows for one fluid (e.g., air) to enter the outlet 304 while blocking others (e.g., liquid Ga).

The apparatus 300 can also include an optional component removal outlet 306. The component removal outlet 306 can allow for the formation of a vacuum seal to be formed with an upper surface 140 of the component 102 if a vacuum or other pressure differential is created in the component removal outlet 306. To that end, the apparatus 300 can include a sealing element 314 (e.g., flange) surrounding the optional component removal outlet 306 and that contacts the upper surface 140 of the component 102 when the apparatus 300 is disposed over the component 102.

Figure 4:
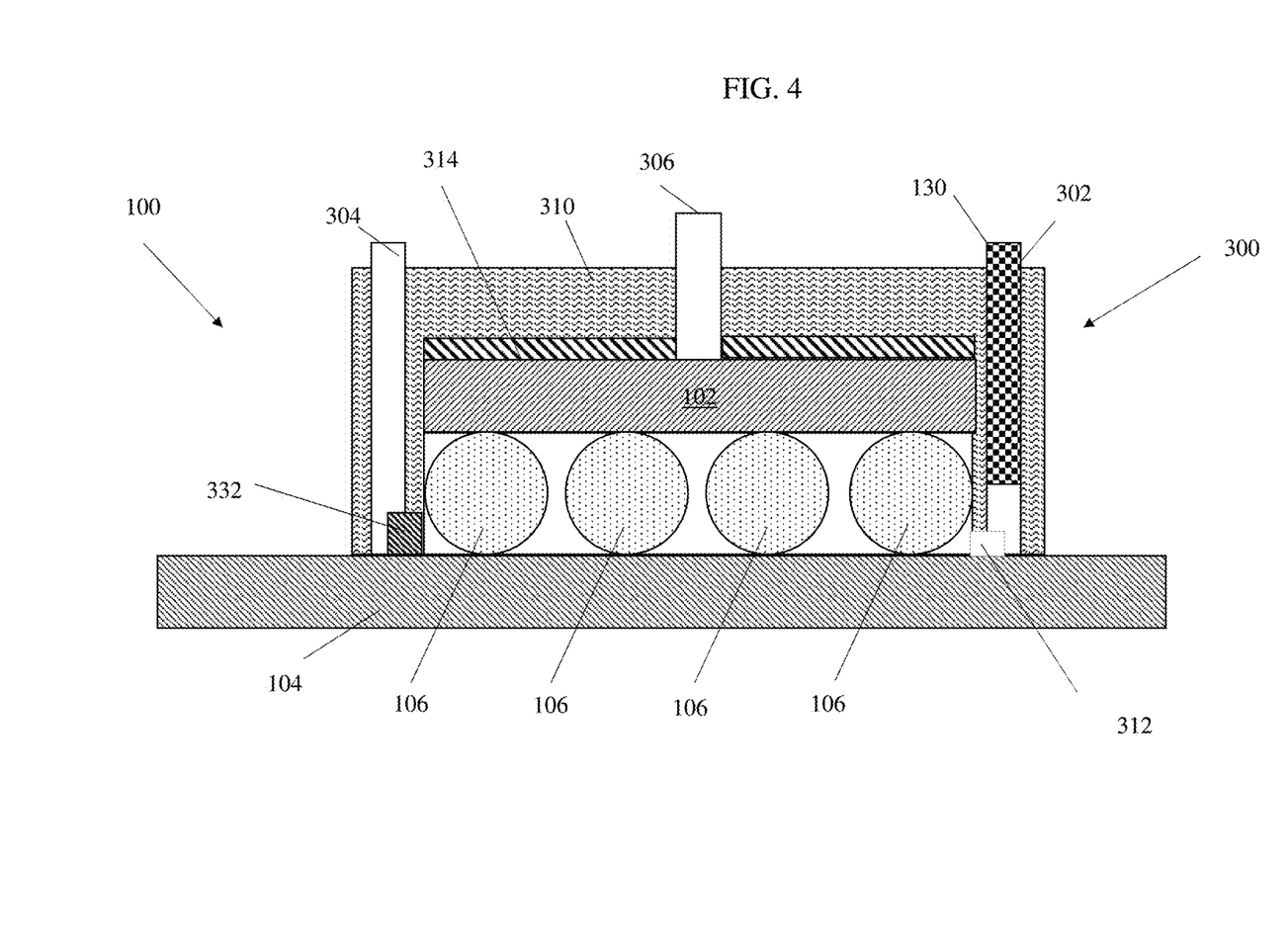
FIG. 4 is a cross-section of the component/substrate combination and removal apparatus as liquid Ga is introduced into the apparatus.

FIG. 4 shows the cross-section of FIG. 3 after liquid Ga 130 has been provided to the inlet 302. The application can be achieved, in one embodiment, by pulling air through the outlet 304.

Figure 5:
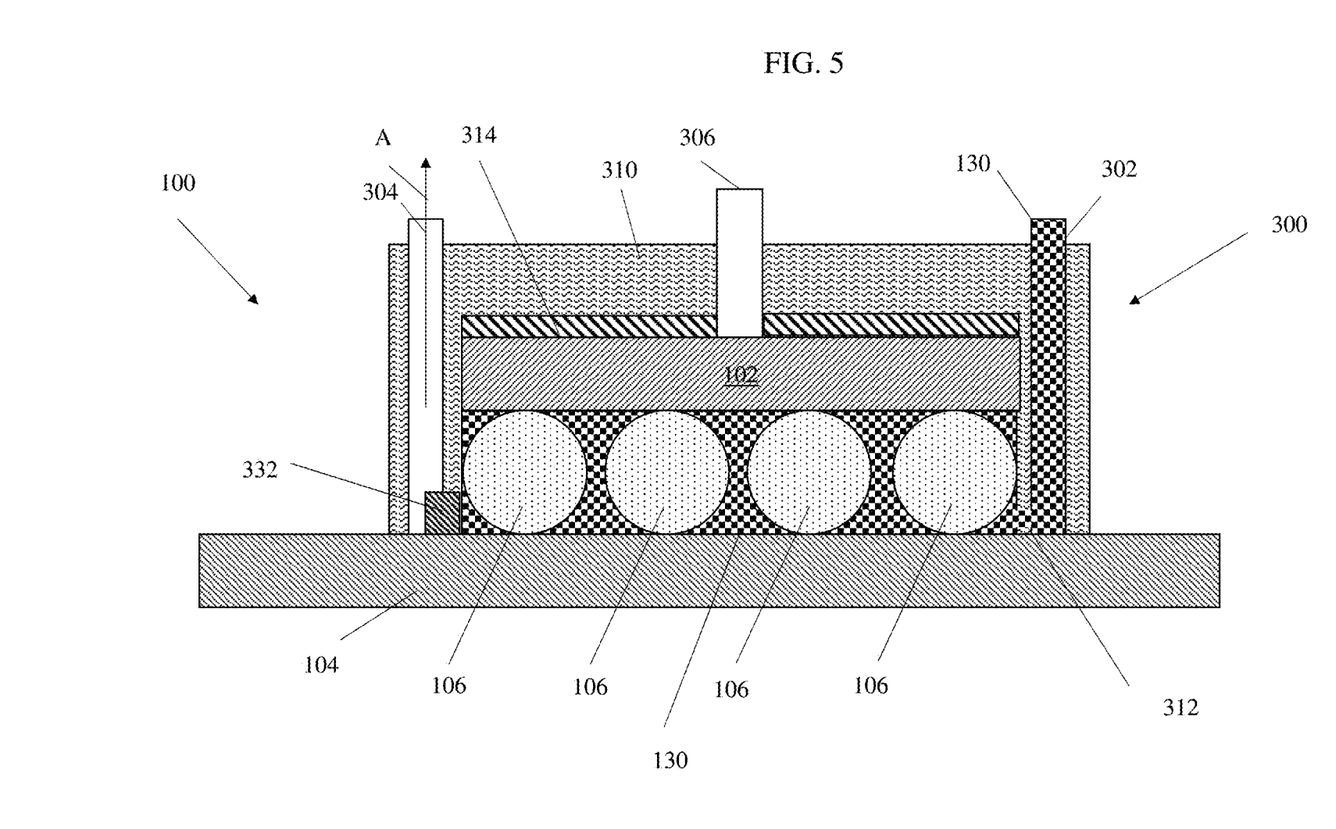
FIG. 5 is a cross-section of the component/substrate combination and removal apparatus after the liquid Ga has been dispersed between the component and the substrate.

FIG. 5 shows air being removed from under the component 102 by application of a vacuum or suction force in direction A. The force causes the liquid Ga 130 to be dispersed under the component 102 by entering through entrance 312 and allows for contact with the connection elements 106. The liquid Ga is prevented from entering the outlet 304 by the optional filter 332.

Figure 6:
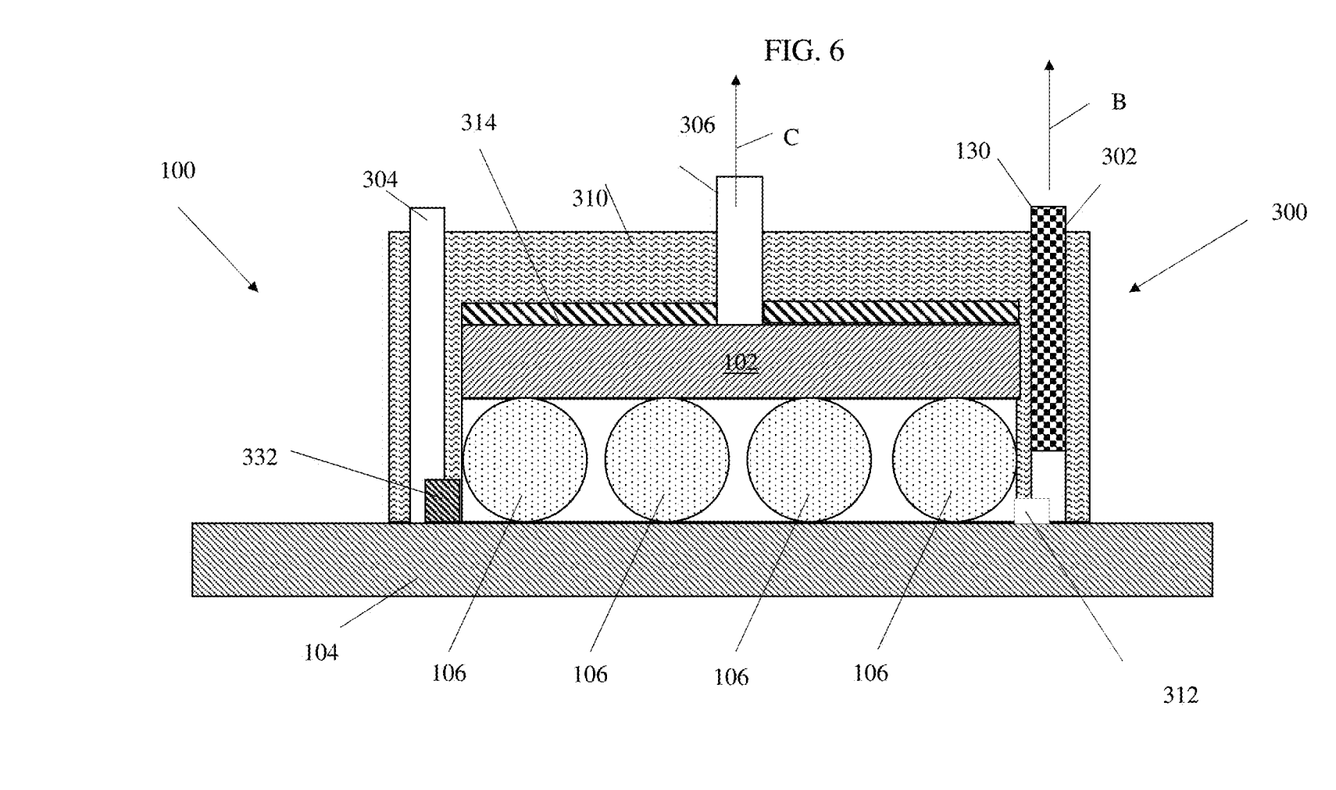
FIG. 6 is a cross-section of the component/substrate combination and removal apparatus as the liquid Ga is being removed.

FIG. 6 shows the liquid Ga 130 being removed by application of a vacuum, suction force, or other pressure differential to inlet 302 in the direction shown by arrow B. Application of a vacuum or other pressure differential to outlet 306 in the direction of arrow C can allow removal of the component 102 when the apparatus 300 is removed.

Figure 7:
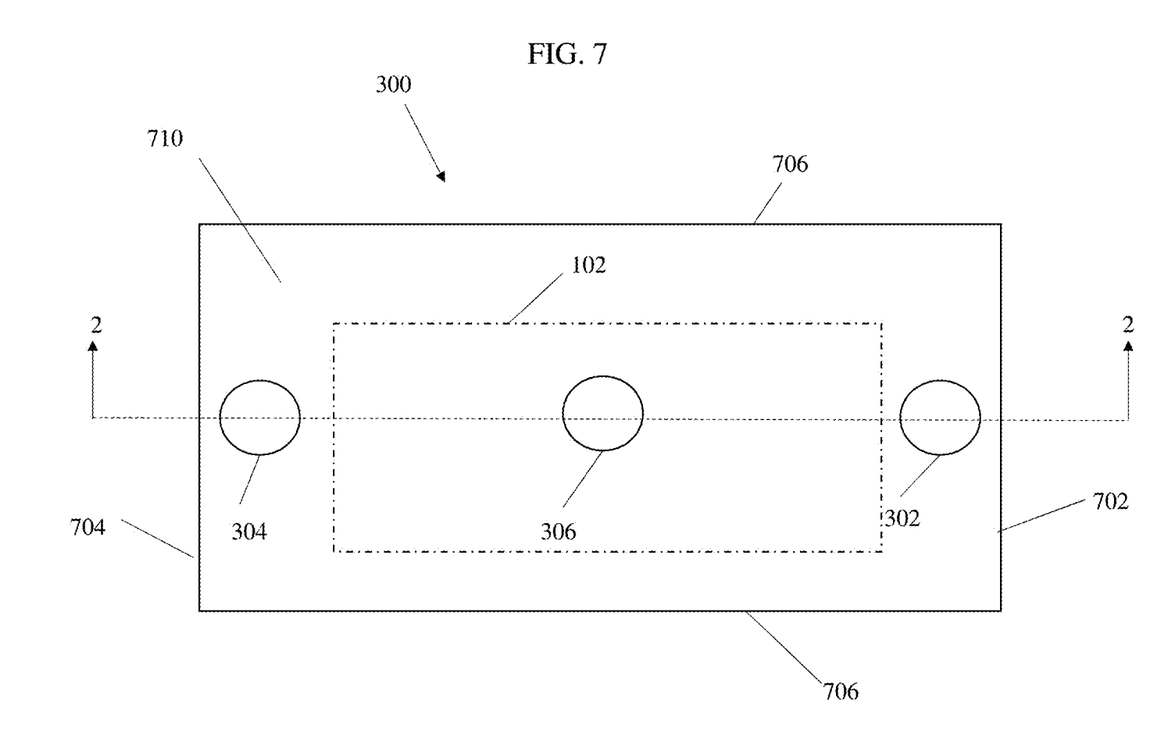
FIG. 7 is a top view of removal apparatus according to one embodiment.

FIG. 7 shows a top view of the apparatus 300. The apparatus 300, as above, includes, includes inlet 302, outlet 304 and component removal outlet 306. The device includes four walls to surround the device 102 (for context, shown by dashed lines in FIG. 7). The walls include and inlet wall 702, an outlet wall 704 and two side walls 706 that connect the inlet and outlet walls 702, 704. The apparatus 300 also includes at top 710 that contacts all four walls. It shall be understood, however, that the 4 walls shown could be replaced by any configuration including, for example, a circular (or any other shape) configuration what includes a depression in its bottom to allow it to be placed over a component. The cross-section of FIGS. 2-6 is taken along line 2-2 of FIG. 7.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for removing an electrical component from a substrate, the component being coupled to the substrate by connection elements, the method comprising:
    disposing liquid gallium (Ga) at or near an edge of the component;
    dispersing the liquid Ga between the substrate and the component such that the liquid Ga contacts one or more of the connection elements, wherein dispersing includes drawing air through an outlet to cause the liquid Ga to be drawn from the edge of the component towards an opposite edge of the component, wherein the air is drawn through a filter that blocks the liquid Ga from entering the outlet;
    maintaining the liquid Ga between the substrate, component and one or more of the connection elements for a prescribed time period; and
    removing the component from the substrate by applying a mechanical force to the component.

2. The method of claim 1, wherein the liquid Ga is dispersed by capillary action.

3. The method of claim 1, wherein the liquid Ga is dispersed by application of a suction force.

4. The method of claim 1, further comprising:
heating the substrate and the electrical component to a temperature between 40 and 100 degrees Celsius.

5. The method of claim 1, further comprising:
removing the liquid Ga before removing the component.

6. The method of claim 1, further comprising:
removing the liquid Ga after removing the component.

7. The method of claim 1, wherein the liquid Ga is formed of liquid Ga particles dispersed in a carrier fluid.

8. The method of claim 7, wherein the carrier fluid is a flux.

9. The method of claim 1, wherein the connection elements are solder balls and the substrate is an organic substrate.

10. The method of claim 9, wherein the solder balls are lead free.

11. The method of claim 1, further comprising:
disposing a removal apparatus over the component.

12. The method of claim 11, wherein:
the liquid gallium (Ga) is disposed at or near the edge of the component through an inlet in the apparatus.

13. The method of claim 12, wherein removing the component from the substrate includes providing a suction force on a component removal outlet of the apparatus that is arranged over an upper surface of the component.

* * * * *